United States Patent [19]

Kotani et al.

[11] Patent Number: 4,873,062
[45] Date of Patent: Oct. 10, 1989

[54] APPARATUS FOR THE GROWTH OF SINGLE CRYSTALS

[75] Inventors: Toshihiro Kotani; Kohji Tada, both of Osaka, Japan

[73] Assignee: Sumitomo Electric Industries, Ltd., Osaka, Japan

[21] Appl. No.: 625,537

[22] Filed: Jun. 28, 1984

[30] Foreign Application Priority Data

Aug. 6, 1983 [JP] Japan ................................. 58-144149
Aug. 6, 1983 [JP] Japan ................................. 58-144150

[51] Int. Cl.$^4$ ............................................. B01D 9/00
[52] U.S. Cl. ................................. 422/249; 156/617.1; 156/620.1; 156/624; 156/DIG. 70; 156/DIG. 72; 156/DIG. 77; 156/DIG. 81; 156/DIG. 92; 156/DIG. 93; 156/DIG. 83
[58] Field of Search ............ 156/617 SP, 617 V, 624, 156/DIG. 93, DIG. 70, DIG. 72, DIG. 77, DIG. 81, DIG. 92, DIG. 83; 202/268, 269; 422/249

[56] References Cited

U.S. PATENT DOCUMENTS

| 1,646,325 | 10/1927 | Strassmann | 202/269 |
| 2,311,349 | 2/1943 | Puening | 202/268 X |
| 3,716,345 | 2/1973 | Grabmaier | 156/DIG. 93 |
| 3,853,487 | 12/1974 | Meuleman et al. | 156/DIG. 93 |
| 3,857,679 | 12/1974 | Allred | 422/249 |
| 4,235,848 | 11/1980 | Sokolov et al. | 156/617 SP X |
| 4,478,675 | 10/1984 | Akai | 156/DIG. 83 X |
| 4,483,735 | 11/1984 | Inada et al. | 156/DIG. 70 |

FOREIGN PATENT DOCUMENTS 54-123585 3/1978 Japan .

OTHER PUBLICATIONS

Moulin et al; Growth of GaAs Single Crystal by a Rotating Liquid Seal Method; J. of Crystal Growth, 24/25 (1974), pp. 376–379.
Leung et al; Liquid-Seal Czochralski Growth of Gallium Arsenide; J. of Crystal Growth, 19 (1973), pp. 356–358.

Primary Examiner—Barry S. Richman
Assistant Examiner—Timothy M. McMahon
Attorney, Agent, or Firm—Wenderoth, Lind & Ponack

[57] ABSTRACT

In an apparatus for the Czochralsky growth of compound single crystals wherein a single crystal growing portion is provided in a sealed vessel whose opening part is sealed by a $B_2O_3$ melt and which contains therein an atmosphere of a volatile element of the compound, at least the inner wall the sealed vessel is made of a material having a melting point of at least 1400° C., selected from Group III–V compounds and oxides of Group III or V elements. Compound single crystals such as GaAs, GaP, InAs, InP, ZnS, ZnSe and CdS obtained by the use of this apparatus are free from contamination with silicon.

7 Claims, 1 Drawing Sheet

APPARATUS FOR THE GROWTH OF SINGLE CRYSTALS

BACKGROUND OF THE INVENTION

1. Field of the Invention

This invention relates to an apparatus for the growth of compound single crystals containing a component element having a higher vapor pressure (which will hereinafter be referred to as a "volatile element") by the Czochraliski method.

2. Description of the Prior Art

The hot wall method is known as a method for the Czochralski growth of single crystals using a molten $B_2O_3$ seal ("Journal of Crystal Growth" 19 (1973) 356–358; "Journal of Crystal Growth" 24/25 (1974) 376/358; Japanese Patent Application OPI (Kokai) No. 123585/1979). In this method, a sealed vessel 1 having a structure as shown in FIG. 1 or FIG. 2 is filled with a vapor of volatile element such as arsenic and pulling is carried out in sealed vessel 1. Sealed vessel 1 is provided inside with crucible 3 containing a raw material melt 2 and pull rod 4 for pulling upward with rotation, to the lower end of which seed crystal 5 is fitted. Referring to FIG. 1, sealed vessel 1 is divided into an upper part and lower part at the side wall and provided with seals 6 and 7 at the opening part of the upper part and lower part and at the neck through which pull rod 4 passes. Referring to FIG. 2, sealed vessel is divided at the bottom and provided with seals 6' and 7 at the opening part of the divided parts and at the neck through which pull rod 4 passes. In both the cases, the seals consist of $B_2O_3$ melt 8. Seed crystal 5 is immersed in raw material melt 2 and wetted therewith, and the crystal is grown and pulled up with revolving seed crystal 5.

These methods have a drawback in that because a quartz vessel is used as a sealed vessel 1, $B_2O_3$ melt 8 reacts with the quartz and there is a large difference in coefficient of thermal expansion, resulting in breakage of the quartz vessel at the contact area with the $B_2O_3$ melt. In addition, the raw material melt 2 is contaminated with silicon from the quartz vessel according to the following reaction:

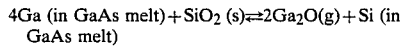

4Ga (in GaAs melt) + $SiO_2$ (s) $\rightleftharpoons$ 2$Ga_2O$(g) + Si (in GaAs melt)

thus resulting in Si contamination of the pulled single crystal and deterioration of the electrical properties.

When there is a difference in pressure between the inside and the outside sealed vessel 1 and pressure balancing is lost, the liquid surface of the liquid seal 8 is fluctuated. In an extreme case, the liquid seal 8 itself falls from sealing portions 6 and 7, resulting in breakage and incompleteness of the sealing. That is, when seal 8, charged before pulling, falls from sealing portions 6 and 7 to break the sealing, volatile component elements such as arsenic leak out and pulling is thus impossible. Consequently, it is necessary to charge again the raw materials for the single crystal and seal.

SUMMARY OF THE INVENTION

It is an object of the present invention to provide an apparatus for the growth of single crystals, whereby the above described disadvantages of the prior art can be overcome.

It is another object of the present invention to provide an apparatus for the Czochralsky growth of GaAs single crystals free from contamination with silicon.

It is a further object of the present invention to provide an apparatus for the growth of GaAs single crystals, which is provided with a means for filling up a liquid seal.

These objects can be attained by an apparatus for the Czochralsky growth of compound single crystals wherein a single crystal growing portion is provided in a sealed vessel whose opening part is sealed by molten $B_2O_3$ and which contains therein an atmosphere of a volatile component element of the compound, characterized in that at least the inner wall of the sealed vessel is made of a material having a boiling point of at least 1400° C., selected from the group consisting of Group III–V compounds and oxides of Group III or V elements.

BRIEF DESCRIPTION OF THE DRAWINGS

The accompanying drawings are to illustrate the principle and merits of the present invention in more detail.

DETAILED DESCRIPTION OF THE INVENTION

The present invention has been made so as to solve the above described problems and thus provides an apparatus for the growth of compound single crystals, free from the breakage of a sealed vessel wherein the pulled single crystals are free from contamination with silicon, in which the sealed vessel is made of a material not reactive with $B_2O_3$ melt.

That is to say, the present invention provides an apparatus for the Czochralsky growth of compound single crystals wherein a single crystal growing portion is provided in a sealed vessel whose opening part is sealed by molten $B_2O_3$ and which contains therein an atmosphere of a volatile component element of the compound, characterized in that at least the inner wall of the sealed vessel is of a heat resistance material having a melting point of at least 1400° C., selected from Group III–V compounds and oxides of Group III or V elements.

In the present invention, the compound single crystals include single crystals of compounds each containing a volatile component element, for example, III–V compounds such as GaAs, GaP, InAs and InP and II–VI compounds such as ZnS, ZnSe and CdS.

The heat resistance material having a melting point of at least 1400° C. includes Group II–V compounds such as pyrolytic boron nitride, boron nitride and aluminum nitride, and oxides of Group III or V elements such as alumina. The whole body of the sealed vessel is not always made of the above described material, but at least the inner surface of the vessel may be of the above described material. In this case, for example, the vessel is made of a composite material consisting of an inner surface of the above described material and an outer surface of a material selected from quartz and graphite, or is made of quartz or graphite the inner surface of which is coated with the above described material.

Figure 1:
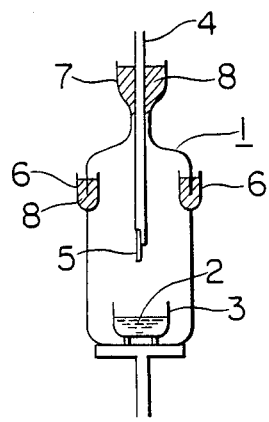
FIG. 1 to FIG. 3 are schematic views of apparatus for the Czochralsky growth of single crystals according to the present invention.
Figure 2:
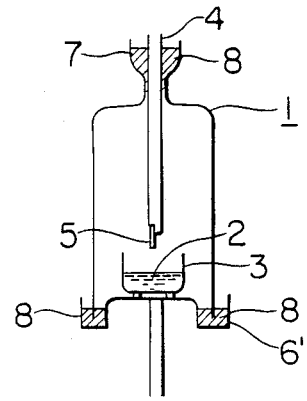

The structures of the apparatus for the growth of single crystals according to one embodiment of the present invention are as shown in FIG. 1 and FIG. 2, but the present invention is not limited thereto. In the present invention, sealed vessel 1 in FIG. 1 or FIG. 2 is made of PBN, AlN or $Al_2O_3$. Sealed vessel 1 is suitably divided as shown in FIG. 1 of FIG. 2 to advantage the interior installation of the apparatus and the opening part and/or shaft part are provided with sealing portions 6, 6' and 7 and sealed by a $B_2O_3$ melt 8 to seal the vessel. A vapor of the volatile component element (e.g., As, P) of compound is filled in vessel 1 while holding the pressure of the atmosphere (Ar or $N_2$) similar to that outside vessel 1, wherein a single crystal is pulled within the apparatus by the Czochralsky method.

Since PBN, BN, AlN or $Al_2O_3$ contains no Si and is very stable chemically to a $B_2O_3$ melt even at high temperatures, no reaction with $B_2O_3$ melt takes place as in a quartz vessel of the prior art, the vessels of PBN or BN is not broken and contamination of a pulled single crystal with Si can be prevented.

In another embodiment of the present invention, a means for supplementing or filling up a liquid seal is provided to keep sealing even if the liquid seal is to pressure unbalancing inside and outside a vessel, whereby means for holding the sealing liquid can be minimized and the vessel can be made compact. That is, this embodiment consists in an apparatus for the Czochralsky growth of compound single crystals wherein a single crystal growing portion is provided in a vessel, preferably made of PBN or BN, whose shaft portion and/or opening portion is sealed by a liquid seal, preferably molten $B_2O_3$, characterized in that the sealed portions are provided with means for supplementing the liquid seal.

Figure 3:
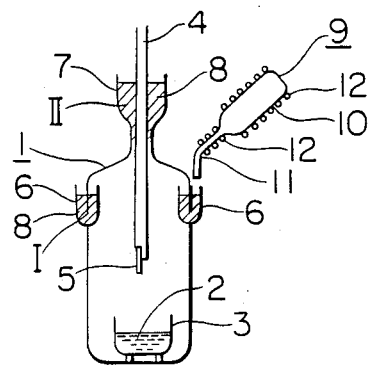

This embodiment will be illustrated is detail by the accompanying drawings. FIG. 3 is a vertically cross-sectional view of the embodiment of the apparatus according to the present invention, in which the same numerals as those of FIG. 1 show the same portions. The difference of FIG. 3 from FIG. 1 is that means 9 for supplementing a liquid seal such as $B_2O_3$ melt to sealing portions 6 and 7 are provided. The other structure is completely the same as that of FIG. 1. Of course, the present invention is not limited to the structure of FIG. 3, but can be adapted for any apparatus for the growth of single crystals by the hot wall method, provided with a liquid sealing portion.

As shown in FIG. 3, for example, sealant supplying means 9 consists of supplying vessel 10 fitted at one end with tube 11, round which heater wire 12 is wound. Supplying vessel 10 is previously charged with a liquid sealant raw material such as $B_2O_3$ and when sealing portion 6 or 7 is lacking in liquid seal 8, electric current is applied to heater wire 12 to melt the sealant such as $B_2O_3$ and the liquid sealant is supplemented to sealing portion 6 or 7 from tube 11. In this case, confirmation of liquid seal 8 in sealing portions 6 and 7 is ordinarily carried out by an eye window using a quartz rod or by an electric detection method using change of electric capacity or electric resistance.

When using $B_2O_3$ melt as liquid seal 8, the material of supplying vessel 10 is preferably molybdenum, PBN, AlN or $Al_2O_3$ which makes reuse possible. Sealant supplying vessel 10 can be provided for common use or one by one to sealing portions 6 and 7, and can be provided outside an outer chamber with a shutter for feeding a sealant.

When such a sealant supplying means 9 is provided, sealing of vessel 1 can always be maintained by supplying the sealant even if liquid sealant 8 falls from sealing portions 6 and 7, resulting in shortage thereof, due to pressure unbalancing inside and outside vessel 1 during pulling a single crystal. Accordingly, leakage of a vapor of a volatile element such as As in vessel 1 can be prevented thus decreasing markedly the loss thereof and making possible the pulling of a single crystal for a long time.

Since in sealing portions 6 and 7, a sealants such as $B_2O_3$ are solid masses when charging at room temperature, the filling efficiency in the sealant holding portion is low and it is thus necessary to enlarge the sealant holding portion in order to charge a sealant raw material such as $B_2O_3$ required for sealing. In the case of charging previously an excess of a sealant raw material to meet the problem of shortage of the liquid seal due to falling or droppoing, it is necessary to further enlarge the volume of the sealant holding portion.

According to the present invention, on the contrary, the sealant holding portion in sealing portions 6 and 7 can be reduced to a minimum and can be made compact because a sealant is charged in another sealant supplying vessel, followed by filling or supplementing suitably the sealant holding portion.

The above described apparatus for the growth of compound single crystals according to the present invention has the following advantages:

(a) Since a sealed vessel is made of a material selected from Group III-V compounds and oxides of Group III or V elements containing no Si and being very stable chemically to $B_2O_3$ melt even at a high temperature and having a higher mechanical strength than quartz even at a high temperature, repeated use of the vessel is possible without subjecting to any damage or breakage.

(b) Since PBN, BN, AlN or $Al_2O_3$, from example, can be prepared with a high purity, for example, with an overall impurity quantity of about 100 ppm, and does not contain Si, contamination of a pulled single crystal with impurities such as Si can be prevented and thus a Si contamination-free single crystal can be obtained in effective manner.

(c) Since PBN, BN, AlN or $Al_2O_3$ has a higher work accuracy than quartz used in the prior art, the dimensional accuracy of the vessel, in particular, at the sealing portion of the shaft part important for sealing is increased and the clearance between the vessel and shaft can be decreased, thus resulting in that $B_2O_3$ melt in the sealing portion can be prevented from falling.

(d) Since a sealant supplying means is provided for supplementing the sealing portion of a vessel with a liquid sealant, i.e. a $B_2O_3$ melt, sealing of the vessel can always be maintained by supplying the sealant even if the liquid sealant falls or drops from the sealing portion, resulting in shortage thereof, due to pressure unbalancing inside and outside the vessel during pulling a single crystal, and accordingly, leakage of a vapor of the atmosphere in the vessel can be prevented, thus decreasing markedly the loss thereof and making possible pulling of a single crystal for a long period of time.

(e) Since the sealant holding portion can be filled from the first time with a liquid seal or can suitably be supplemented therewith by provision of the sealant supplying means, the sealant holding portion does not need an excessive volume for compensating an increased volume of solid raw material as described above and compensating the loss of a liquid seal due to falling and can be reduced to a minimum. Thus, a sealed vessel can be made compact.

EXAMPLE 1

A GaAs single crystal was grown by the Czochralsky method using an apparatus for the growth of single crystals, as shown in FIG. 1 comprising sealed vessel 1 made of BN with an outer diameter of 120 mm and a length of 700 mm.

In sealed vessel 1 was set PBN crucible 3 charged with 1 kg of a GaAs polycrystal, and was charged with 20 g of metallic As for feeding As vapor. As pull rod 4 there was used a molybdenum rod which is not attacked by a $B_2O_3$ melt and As vapor. After melting GaAs at a temperature of 1260° C., a single crystal was drawn at a rate of 5 mm/hr with lowering gradually the temperature (0.03°–0.05° C./min) while observing and controlling the diameter of the single crystal by means of a weight measuring device or observing device.

The thus resulting GaAs single crystal had a diameter of 2" and length of about 60 mm, an Si content of less than $1 \times 10^{15}$ cm$^{-3}$ by SIMS analysis and a semi-insulating property of a specific resistance of $5 \times 10^7$ Ωcm (undoped).

On the other hand, another GaAs single crystal obtained by repeating the above described procedure except using a quartz vessel of the prior art as sealed vessel 1 has a higher Si content, i.e. $6 \times 10^{16}$ cm$^{-3}$ and a lowered specific resistance.

The BN vessel used herein was hardly damaged and was capable of being used about 15 times repeatedly. In the quartz vessel of the prior art, it was difficult to hold the clearance at the rod part less than 0.1 mm and falling of $B_2O_3$ melt took place during pulling, while in the BN vessel of the present invention, it was possible to hold the rod clearance less than 0.05 mm and to substantially prevent $B_2O_3$ from falling.

EXAMPLE 2

A GaAs single crystal was grown by the Czochralsky method using an apparatus for the growth of single crystals, as shown in FIG. 1, comprising a sealed vessel 1 made of AlN with an outer diameter of 120 mm and a length of 700 mm.

In the sealed vessel 1 was set PBN crucible 3 charged with 1.2 kg of a GaAs polycrystal, and was charged with 50 g of metallic As for feeding As vapor. As pulled rod 4 there was used a molybdenum rod which is not attacked by a $B_2O_3$ melt and As vapor. As vapor at a pressure of about 1 atm was held inside the vessel and nitrogen gas at a pressure of about 1 atm was held outside the vessel. After melting the GaAs polycrystal at a temperature of 1260° C., a single crystal was drawn at a rate of 5 mm/hr with lowing gradually the temperature of the crucible. The diameter of the single crystal, during seeding and pulling, was controlled by measurement of the weight of the crystal.

The thus resulting GaAs single crystal had a diameter of 2", a length of about 75 mm and a good semiinsulating property, i.e. specific resistivity of from front to tail of $2 \times 10^7$ Ωcm (undoped). SIMS analysis showed an Si content of less than $1 \times 10^{15}$ cm$^{-3}$ and an Al content of $2 \times 10^{15}$ cm$^{-3}$.

The vessel of AlN used in this example could be used repeatedly 10 times without any breakage.

EXAMPLE 3

A GaAs compound semiconductor single crystal was grown using an apparatus for the growth of single crystals, as shown in FIG. 3, a comprising sealed vessel 1 made of PBN with an outer diameter of 90 mm and a length of 350 mm.

Using a $B_2O_3$ melt as liquid sealant 8, an atmosphere of As vapor under a pressure of about 1 atm was held in sealed vessel 1. The $B_2O_3$ melt holding portion I, at sealing portion 6, had a volume of 47 cm$^3$ in which 40 g of $B_2O_3$ was charged and the $B_2O_3$ melt holding portion II at sealing portion 7 had a volume of 50 cm$^3$ in which 50 g of $B_2O_3$ was charged. Since the density of $B_2O_3$ is about 1.7 g/cm$^3$ at room temperature, the required volumes of holding portions I and II are originally 24 cm$^3$ and 29 cm$^3$. Thus, volumes of 1.7 to 2 times as large as originally required was actually used to charge the above described amounts of $B_2O_3$.

When using the above described growth apparatus having no sealant supplying means 9, about 10 g of $B_2O_3$ was lost at $B_2O_3$ melt holding portion I and about 20–25 g of $B_2O_3$ was lost at holding portion II. Particularly, at sealing portion 7, the $B_2O_3$ melt tends to fall from holding portion II due to a pressure unbalancing, resulting in large loss thereof and leakage of As vapor.

On the other hand, a sealant supplementing means 9 consisting of a supplying cylindrical vessel 10 with a diameter of 50 mm and a length of 60 mm, made of molybdenum and fitted at one end with tube 11, a round which heater wire 12 of Kanthal was wound, was provided at sealing portion 6. A power of about 800 W was applied to the heater.

About 100 g of $B_2O_3$ was charged in cylindrical vessel 10 and supply of $B_2O_3$ to sealing portion 6 was carried out by "ON-OFF" of electric current to heater wire 12. By the provision of sealant supplementing means 9, $B_2O_3$ melt fallen and lost at sealing portion 6 could be supplemented and the volume of $B_2O_3$ melt holding portion I could be reduced from 47 cm$^3$ to 35 cm$^3$, thus making vessel 1 compact.

What is claimed is:

1. In an apparatus for the Czochralsky growth of compound single crystals wherein a single crystal seed held by a pull rod is provided in a sealed vessel which vessel has a closed end and an opened end sealed by immersion of the open end of the vessel in a $B_2O_3$ melt and which contains therein a crucible containing a raw material melt of the compound and an atmosphere of a volatile element of the compound, the improvement wherein at least the inner surface of the sealed vessel is made of a heat resistance material having a melting point of at least 1400° C., selected from the group consisting of pyrolytic and aluminum nitride, boron nitride, 2. The apparatus of claim 1, wherein the compound single crystal is selected from the group consisting of single crystals of GaAs, GaP, InAs, InP, ZnS, ZnSe and CdS.

3. The apparatus of claim 1, wherein the heat resistance material is pyrolytic boron nitride.

4. The apparatus of claim 1, wherein the heat resistance material is aluminum nitride.

5. The apparatus of claim 1, wherein the $B_2O_3$ melt sealed part is provided with a sealant supplying means for supplementing the $B_2O_3$ melt.

6. The apparatus of claim 5, wherein the sealant supplying means has a supplying vessel made of a material selected from the group consisting of molybdenum, pyrolytic boron nitride, boron nitride, aluminum nitride and alumina.

7. The apparatus of claim 5, wherein the sealant supplying means consists of a supplying vessel fitted at one end with a tube, around which a heater wire is wound.

* * * * *